(12) United States Patent
Curtis

(10) Patent No.: US 9,587,964 B2
(45) Date of Patent: Mar. 7, 2017

(54) CAPACITIVE PROXIMITY DETECTION USING DELTA-SIGMA CONVERSION

(71) Applicant: Microchip Technology Incorporated, Chandler, AZ (US)

(72) Inventor: Keith Curtis, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 356 days.

(21) Appl. No.: 14/301,462

(22) Filed: Jun. 11, 2014

(65) Prior Publication Data

US 2014/0368222 A1  Dec. 18, 2014

Related U.S. Application Data

(60) Provisional application No. 61/834,236, filed on Jun. 12, 2013.

(51) Int. Cl.
*G01R 27/26* (2006.01)
*G01D 5/24* (2006.01)
*H03K 17/955* (2006.01)
*H03M 3/00* (2006.01)

(52) U.S. Cl.
CPC ............. *G01D 5/2405* (2013.01); *G01D 5/24* (2013.01); *G01R 27/2605* (2013.01); *H03K 17/955* (2013.01); *H03M 3/456* (2013.01); *H03M 3/462* (2013.01); *H03M 3/494* (2013.01); *G01R 27/26* (2013.01); *G05B 2219/37284* (2013.01); *H03K 2217/960725* (2013.01)

(58) Field of Classification Search
CPC ...... G01R 27/26; G01R 27/2605; G01D 5/24; G01D 5/2405; G01D 5/21; G01D 5/2412; G01D 5/2417; G06F 3/0414; G06F 3/044; G06F 2203/04103; G06K 9/0002; G05B 2219/37284; H03K 17/955; H03K 2217/960725; H03M 3/30; H03M 3/456; H03M 3/462; H03M 3/494
USPC ..... 324/600, 649, 658, 663, 672; 702/47, 52
See application file for complete search history.

(56) References Cited

U.S. PATENT DOCUMENTS

| 4,887,024 | A | * | 12/1989 | Sugiyama | G01R 27/2605 324/674 |
|---|---|---|---|---|---|
| 8,089,289 | B1 | | 1/2012 | Kremin et al. | 324/678 |
| 8,446,158 | B1 | | 5/2013 | Jansson | 324/686 |
| 9,442,144 | B1 | * | 9/2016 | Ryshtun | H03K 17/962 |
| 2009/0009491 | A1 | | 1/2009 | Grivna | 345/184 |
| 2010/0141275 | A1 | * | 6/2010 | Matsushima | G06F 3/044 324/678 |

(Continued)

FOREIGN PATENT DOCUMENTS

WO  2006/132960 A1  12/2006  ............ G01R 27/26

OTHER PUBLICATIONS

International Search Report and Written Opinion, Application No. PCT/US2014/042036, 15 pages, Sep. 4, 2014.

*Primary Examiner* — Hoai-An D Nguyen
(74) *Attorney, Agent, or Firm* — Slayden Grubert Beard PLLC

(57) ABSTRACT

Capacitive proximity detection is provided by combining a delta-sigma modulator and a capacitive voltage divider circuit to create a high resolution capacitive-to-digital converter. Period and duty cycle counters provide duty cycle ratios from the delta-sigma modulator for comparison of changes in capacitance values of a capacitive sensor when an object is in proximity thereto.

26 Claims, 7 Drawing Sheets

(56) References Cited

U.S. PATENT DOCUMENTS

| | | | |
|---|---|---|---|
| 2010/0283485 A1* | 11/2010 | Valisuo | G01D 5/24 324/663 |
| 2011/0068810 A1 | 3/2011 | Yeates et al. | 324/676 |
| 2012/0139764 A1 | 6/2012 | Sosio et al. | 341/110 |
| 2013/0076375 A1 | 3/2013 | Hanumanthaiah et al. | 324/661 |

* cited by examiner

CAPACITIVE PROXIMITY DETECTION USING DELTA-SIGMA CONVERSION

RELATED PATENT APPLICATION

This application claims priority to commonly owned U.S. Provisional Patent Application No. 61/834,236; filed Jun. 12, 2013; and is hereby incorporated by reference herein for all purposes.

TECHNICAL FIELD

The present disclosure relates to proximity detection, and, in particular, to capacitive proximity detection using delta-sigma conversion.

BACKGROUND

Capacitive proximity detection requires very high resolution conversions (>10-12 bits) of capacitance values. Proximity based detection systems using existing capacitive touch solutions require repeated measurements, averaging results, and therefore a high processing time overhead that are not suited for low power applications.

SUMMARY

Therefore a need exists for a low power, high resolution capacitance change detection system, method and apparatus. The capacitance change may be the result of an object coming into the proximity of a capacitive sensor.

According to an embodiment, a proximity detection system may comprise: a comparator having first and second inputs and an output, wherein the second input may be coupled with a reference voltage and the first input may be coupled with a holding capacitor; a capacitive sensor; a switch for coupling the capacitive sensor alternately to a voltage and the holding capacitor; a clock having an output; a flip-flop having an input coupled with the output of the comparator, a clock input coupled to the output of the clock and an output; a feedback resistor coupled between the output of the flip-flop and the first input of the comparator; a duty cycle counter having a clock input coupled to the output of the clock, a reset input, and an enable input coupled to the output of the flip-flop, and an output for providing a number of clock outputs counted, wherein the duty cycle counter only counts the clock outputs when the enable input thereof may be at a first logic level; and a circuit for controlling the switch whenever the output of the flip-flop goes from a second logic level to the first logic level; wherein the number of clock outputs counted may be used in determining proximity of an object to the capacitive sensor.

According to a further embodiment, a period counter having a clock input coupled to the output of the clock, a reset/enable input and a carry output may be provided, wherein the period counter determines a measurement time period. According to a further embodiment, count values in the duty cycle and period counters may be used in determining a duty cycle dependent upon a capacitance value of the capacitive sensor. According to a further embodiment, the duty cycle may be the count value in the duty cycle counter divided by the count value in the period counter. According to a further embodiment, a digital processor and memory may be coupled to the clock, and the duty cycle and period counters, wherein the digital processor reads the count values from the duty cycle and period counters, and therefrom determines duty cycles related to capacitance values of the capacitive sensor. According to a further embodiment, the duty cycles related to capacitance values of the capacitive sensor may be stored in the digital processor memory and compared in determining whether a duty cycle change indicates a detection of an object proximate to the capacitive sensor.

According to a further embodiment, the carry output of the period counter generates an interrupt signal to the digital processor. According to a further embodiment, the voltage coupled to the capacitive sensor may be at a logic high. According to a further embodiment, the voltage coupled to the capacitive sensor may be at a logic low. According to a further embodiment, an output driver may have an input coupled the digital processor and an output coupled to the switch wherein the voltage coupled to the capacitive sensor alternates between a logic high and a logic low for sequential duty cycle periods. According to a further embodiment, a microcontroller comprises the digital processor and memory, the comparator, the clock, the flip-flop, the feedback resistor, the duty cycle counter, the period counter, the switch, and the circuit for controlling the switch. According to a further embodiment, the feedback resistor may be replaced with a current source and a current sink. According to a further embodiment, a resistance value of the feedback resistor may be programmably adjustable. According to a further embodiment, a capacitance value of the holding capacitor may be programmably adjustable.

According to another embodiment, a method for detecting an object proximate to a capacitive sensor may comprise the steps of: charging a capacitive sensor to a first voltage; coupling the charged capacitive sensor in parallel with a holding capacitor; comparing a resulting voltage on the parallel connected capacitive sensor and holding capacitor to a reference voltage with a voltage comparator, wherein: if the resulting voltage may be greater than the reference voltage then partially discharge the holding capacitor to a lower voltage, and if the resulting voltage may be less than the reference voltage then partially charge the holding capacitor to a higher voltage and add one count to a duty cycle counter; add one count to a period counter; return to the step of charging the capacitive sensor to the first voltage.

According to a further embodiment of the method, may comprise the steps of: storing a plurality of duty cycle period counts; and calculating duty cycles from the plurality of duty cycle counts divided by respective ones of the plurality of period counts. According to a further embodiment of the method, may comprise the step of determining changes in capacitance values of the capacitive sensor from the duty cycles. According to a further embodiment of the method, may comprise the step of determining proximity of an object to the capacitive sensor from the duty cycles.

According to yet another embodiment, a method for detecting an object proximate to a capacitive sensor may comprise the steps of: discharging a capacitive; coupling the discharged capacitive sensor in parallel with a holding capacitor; comparing a resulting voltage on the parallel connected capacitive sensor and holding capacitor to a reference voltage with a voltage comparator, wherein: if the resulting voltage may be less than the reference voltage then partially charge the holding capacitor to a higher voltage, and if the resulting voltage may be greater than the reference voltage then partially discharge the holding capacitor to a higher voltage and add one count to a duty cycle counter; add one count to a period counter; return to the step of charging the capacitive sensor to the first voltage.

According to a further embodiment of the method, may comprise the steps of: storing a plurality of duty cycle period counts; and calculating duty cycles from the plurality of duty cycle counts divided by respective ones of the plurality of period counts. According to a further embodiment of the method, may comprise the step of determining changes in capacitance values of the capacitive sensor from the duty cycles. According to a further embodiment of the method, may comprise the step of determining proximity of an object to the capacitive sensor from the duty cycles.

According to still another embodiment, an apparatus for proximity detection may comprise: a comparator having first and second inputs and an output, wherein the second input may be coupled with a reference voltage and the first input may be coupled with a holding capacitor; a switch adapted for coupling a capacitive sensor alternately to a voltage and the holding capacitor; a clock having an output; a flip-flop having an input coupled with the output of the comparator, a clock input coupled to the output of the clock and an output; a feedback resistor coupled between the output of the flip-flop and the first input of the comparator; a duty cycle counter having a clock input coupled to the output of the clock, a reset input, an enable input coupled to the output of the flip-flop, and an output for providing a number of clock outputs counted, wherein the duty cycle counter only counts the clock outputs when the enable input thereof may be at a first logic level; and a circuit for controlling the switch whenever the output of the flip-flop goes from a second logic level to the first logic level.

According to a further embodiment, the number of clock outputs counted may be used in determining proximity of an object to the capacitive sensor. According to a further embodiment, the number of clock outputs counted may be used in determining changes in capacitances values of the capacitive sensor. According to a further embodiment, the feedback resistor may be replaced with a current source and a current sink. According to a further embodiment, a resistance value of the feedback resistor may be programmably adjustable. According to a further embodiment, a capacitance value of the holding capacitor may be programmably adjustable.

According to another embodiment, an apparatus for proximity detection may comprise: a voltage summer having first and second inputs and an output; a switch adapted for coupling a capacitive sensor alternately to a voltage and the first input of the voltage summer; a clock having an output, wherein at each clock pulse the switch briefly couples the capacitive sensor to the voltage then back to the first input of the voltage summer; a voltage reference having a reference voltage output; an operational amplifier having a first input coupled to an output of the voltage summer and a second input coupled to the output of the voltage reference; an integrating capacitor coupled between the first input of the operational amplifier and an output thereof; an analog-to-digital converter (ADC) having an input coupled to the output of the, wherein the ADC converts the operational amplifier output to a multi-bit digital representation thereof; a digital-to-analog converter (DAC) having inputs coupled to the ADC and converting the multi-bit digital representation from the ADC into an analog feedback voltage coupled to the second input of the voltage summer; a decimating filter having inputs coupled to the multi-bit digital representation from the ADC; and a digital signal processor (DSP) coupled to the decimating filter, wherein the DSP determines when an object may be proximate to the capacitive sensor. According to a further embodiment, the ADC, DAC and decimating filter may be synchronized together with clock pulses from the clock.

BRIEF DESCRIPTION OF THE DRAWINGS

A more complete understanding of the present disclosure may be acquired by referring to the following description taken in conjunction with the accompanying drawings wherein.

Figure 1:
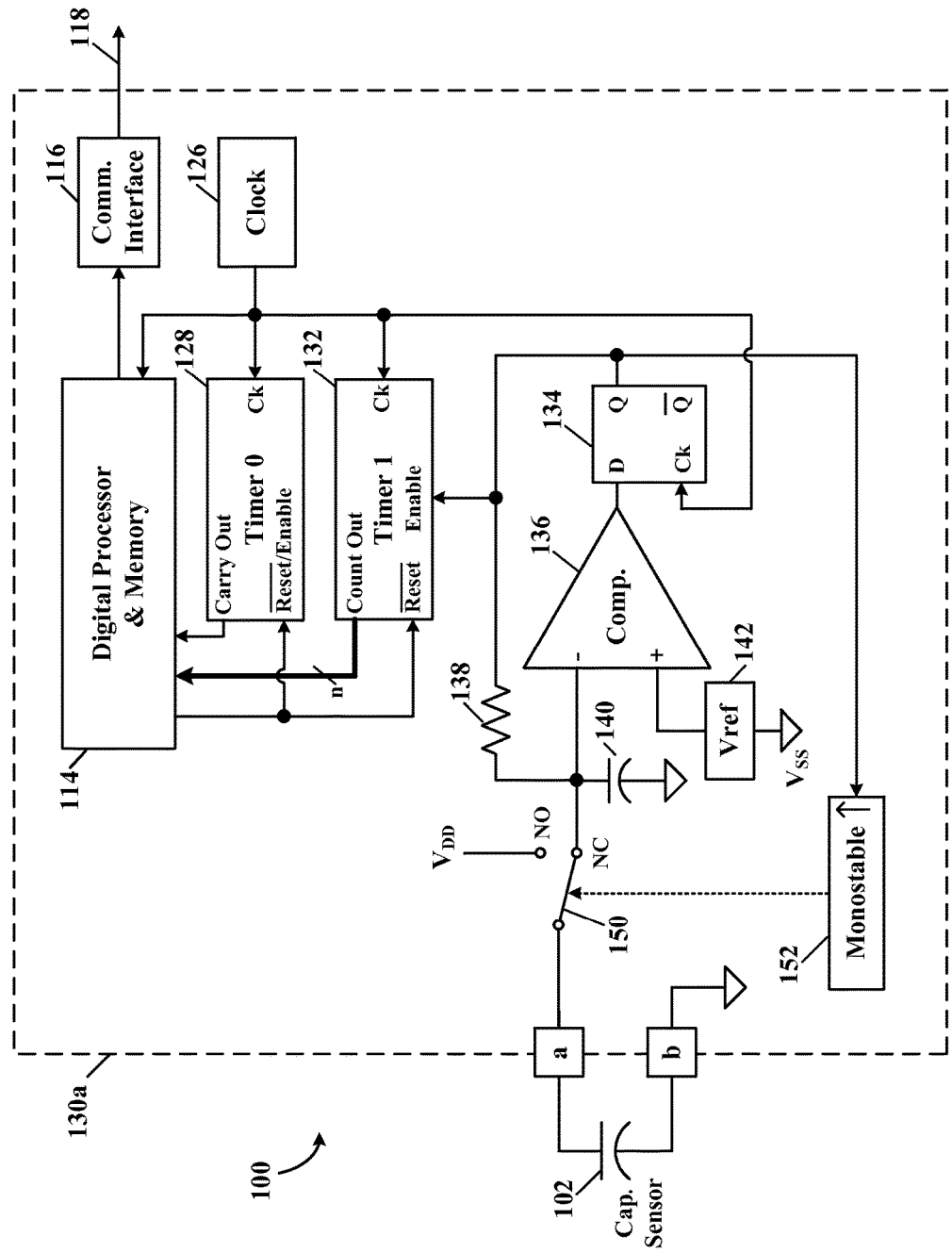
FIG. 1 illustrates a schematic block diagram of a capacitive proximity detection system comprising a capacitive sensor and a delta-sigma analog-to-digital converter, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, a capacitive proximity detection system, method and apparatus may be provided by combining a delta-sigma modulator and a capacitive voltage divider circuit to create a high resolution capacitive-to-digital converter that may be used to detect small changes in capacitance values of a capacitive sensor caused by an object coming in proximity thereto.

Combining delta-sigma conversion with capacitive measurement has several advantages. A delta-sigma converter has adjustable resolution and can operate without digital processor overhead. It may operate in a low power mode during capacitance measurements when the digital processor is in a low power sleep mode.

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a capacitive proximity detection system comprising a capacitive sensor and a delta-sigma analog-to-digital converter, according to a specific example embodiment of this disclosure. A capacitive proximity detection system, generally represented by the numeral 100, may comprise a capacitive sensor 102, a digital processor and memory 114, a first timer/counter 128, a second timer counter 132, a D flip-flop 134, a voltage comparator 136, a voltage reference 142, a holding capacitor 140, a feedback resistor 138, a single pole double throw switch 150, a one shot monostable generator 152, a clock 126, a communications interface 116, and a communications port 118. The aforementioned elements, except for the capacitive sensor 102 may be provided by a mixed signal (having both analog and digital circuits) integrated circuit device 130, e.g., application specific integrated circuit (ASIC), a programmable logic array, a simple digital state machine (e.g., used as a standalone peripheral), or microcontroller. The communications interface 116 may be a serial communications interface, e.g., RS-232, USB, SPI, I²C, Microwire or UNI/O and the like, and may provide data, e.g., proximity detection and alarm through the communications port 118, a parallel bus (not shown) and/or individual indicators (e.g., LEDs) (not shown) that set/clear when a person or object is in proximity to the capacitive sensor 102.

The capacitive sensor 102 is charged to a voltage, e.g., $V_{DD}$, in a short time by a circuit that connects the capacitive sensor 102 thereto. This circuit may comprise, but is not limited to, a switch 150 controlled by a one shot monostable generator 152 that causes the switch 150 to briefly couple the capacitive sensor 102 to $V_{DD}$ and then back to a parallel connection with the holding capacitor 140. The monostable generator 152 and switch 150 are shown for explanatory purposes but one having ordinary skill in digital circuit design and the benefit of this disclosure could easily come up with alternate and equally effective circuits for quickly charging and then reconnecting the capacitive sensor 102 with the holding capacitor 140. The capacitance value of the holding capacitor 140 is larger than the capacitance value of the capacitive sensor 102 so that a charge of $V_{DD}$ thereon will not significantly change the voltage charge of the holding capacitor 140 when connected in parallel therewith. Typical values for the holding capacitor 140 may be, but are not limited to, from about 20 to about 500 picofards. Typical values for the capacitive sensor 102 may be, but are not limited to, from about 5 to about 50 picofards. With a capacitive value change from no object in close proximity to an object in close proximity may be, but is not limited to, from about 0.1 to 0.5 percent of the capacitance value of the proximity sensor 102, e.g., from about one (1) to about 250 femto-farads.

Over a long time period, a voltage on the holding capacitor 140 will settle to a voltage of plus or minus approximately the voltage (reference voltage) from the voltage reference 142. This is the delta-sigma modulator voltage equilibrium point. The reference voltage may be any value less than $V_{DD}$ or greater than $V_{SS}$, e.g., $V_{DD}*3/4$, $V_{DD}/2$, $V_{DD}/4$, etc., preferably the reference voltage may be $V_{DD}/2$ because it may give the greatest measurement range. The voltage on the $V_{DD}$ charged capacitive sensor 102 is divided between the two capacitors based on their individual capacitance values and the voltages thereon. Initially, the voltage on the capacitive sensor 102 is greater than the voltage on the holding capacitor 140, so that when both capacitors are connected in parallel the resulting voltage will be greater than the holding capacitor 140 initial voltage, e.g., $V_{DD}/2$. If the capacitance of the capacitive sensor 102 changes, then the voltage division across the two capacitors will change, resulting in a change in the voltage on the holding capacitor 140.

The comparator 136 and the D flip-flop 134 comprise a delta-sigma modulator. When the voltage on the holding capacitor 140 is greater than the reference voltage, Vref, the output of the comparator 136 goes low and the Q-output from D flip-flop 134 goes low, e.g., $V_{SS}$, after the next clock pulse. Since the low output from the D flip-flop 134 will be less than the voltage on the holding capacitor 140, the holding capacitor 140 will discharge to a lower voltage through the feedback resistor 138. When the voltage on the holding capacitor 140 is less than the reference voltage, Vref, the output of the comparator 136 goes high and the Q-output from D flip-flop 134 goes high, e.g., $V_{SS}$, after the next clock pulse. Since the high output from the D flip-flop 134 will be greater than the voltage on the holding capacitor 140, the holding capacitor 140 will charge to a high voltage through the feedback resistor 138. Typical values for the feedback resistor 138 may be, but are not limited to, from about 100 ohms to about 10,000 ohms. Preferable the feedback resistor 138 may add/subtract an amount of charge from the holding capacitor 140 that is similar in size to the amount of charge added by the capacitive sensor 102 when it is connected to the holding capacitor 140. The charge, Q, on the holding capacitor 140 may be determined from V=q/C, and dV=dq/C, wherein the voltage change on the holding capacitor 140, divided by the capacitance value thereof gives the change in charge thereon. The amount of charge that the resistor supplies may be determined by q=t*(Vdd−Vcap)/R, t=clock period.

First and second timer/counters 128 and 132 form a duty cycle measurement system. The second timer/counter 132 determines the length of time that a capacitance-to-digital value conversion takes place, the first timer/counter 132 counts the number of clock pulses that occur during this conversion time when the voltage on the holding capacitor is less than the reference voltage. The second timer/counter 132 will only count clock pulses when its enable input is high (output from the D-flip-flop 134). The delta-sigma conversion period may run until there is a carry out (overflow) from the first timer/counter 128. This carry out may be used to alert the digital processor 114 that the conversion period is over. Wherein the digital processor 114 may read the count value from the second timer/counter 132, e.g., over an n-bit bus, and compute the duty cycle ratio represented by the count value from the second timer/counter 132 divided by the maximum count value (conversion period) of the first timer/counter 128. Thereafter the digital processor 114 may reset the first and second timer/counters 128 and 132.

A binary ten (10) bit count value $2^{10}$ will have a 1024 count granularity; a binary twenty (20) bit count value $2^{20}$ will have a 1,048,576 count granularity, etc. Obviously, the greater the number of bits that the first and second timer/counters 128 and 132 have, the greater the resolution and the finer the change in capacitance value that may be determined. However, a timer/counter having a greater number of bits requires a longer capacitance-to-binary conversion time. From the count values read from the second timer/counter 132, the digital processor may determine when the capacitive sensor 102 has a change in capacitance value.

Figure 3:
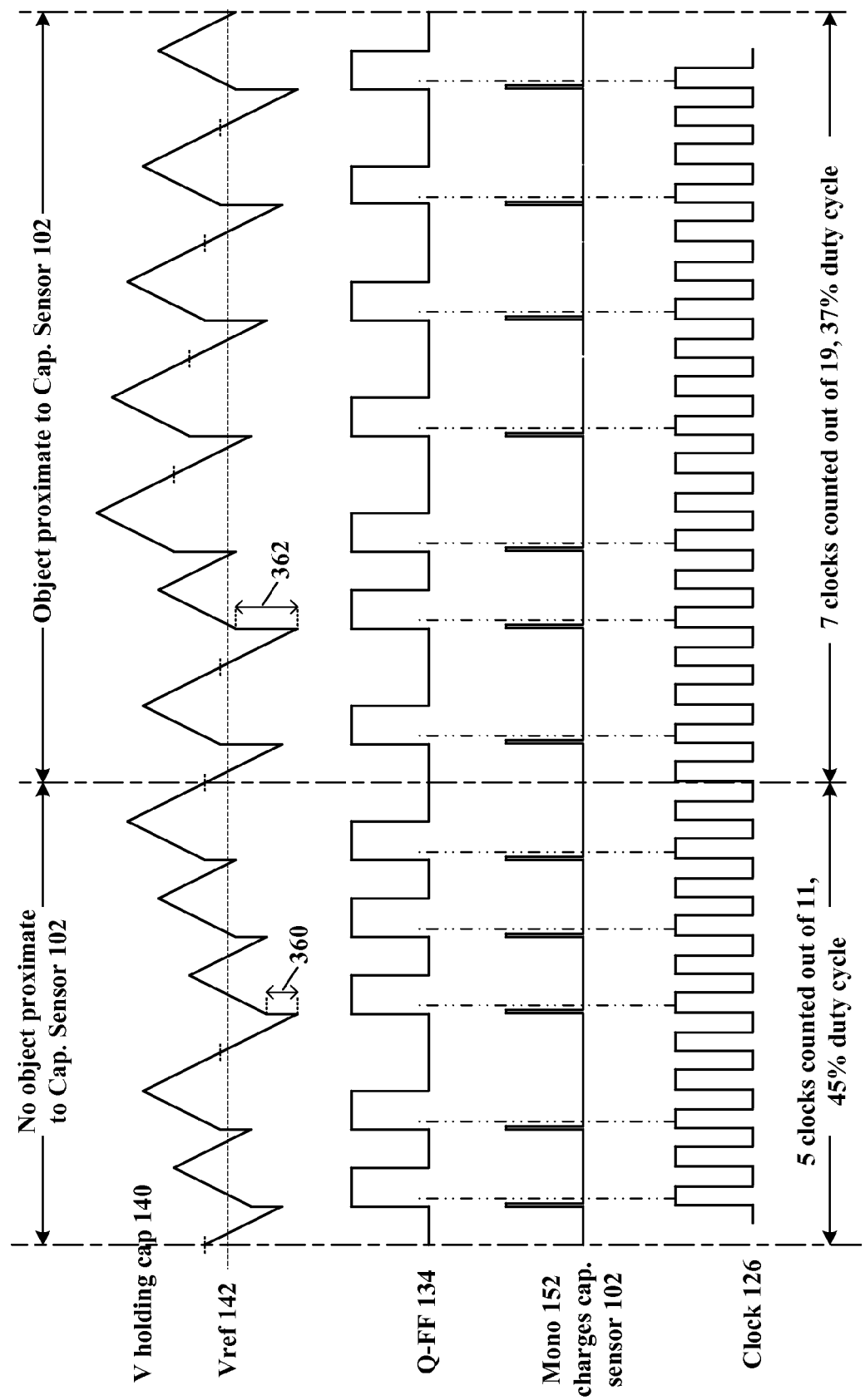
FIG. 3 illustrates a schematic timing diagram of the operation of a capacitive proximity detection system, according to specific example embodiments of this disclosure.

Referring to FIG. 3, depicted is a schematic timing diagram of the operation of a capacitive proximity detection system, according to specific example embodiments of this disclosure. Over a long time period and without external voltage influence the voltage on the holding capacitor 142 will be the reference voltage plus or minus a very small error voltage. This results in a duty cycle of approximately 50 percent. The duty cycle may be defined as the number of clock pulses counted by the first timer/counter 128 during the time it takes for the second timer/counter 132 to count from zero to its maximum bit count that produces a carry out (or from a preloaded digital value to the its maximum bit count) divided by that maximum bit count, e.g., number of clock pulses counted during a capacitance-to-digital value conversion by the delta-sigma modulator.

When an external voltage is introduced to the holding capacitor 140 from the capacitive sensor 102 the resulting voltage thereon will be more positive than the reference voltage if the voltage from the capacitive sensor 102 is more positive than the initial voltage on the holding capacitor 140. How much more positive depends on the capacitance value of the capacitive sensor 102 that has been charged to, for example, $V_{DD}$. Since the capacitance value of the capacitive sensor 102 is less than the capacitance value of the holding capacitor, the positive increase of the resulting voltage on the holding capacitor will be a percentage of the initial voltage thereon and if the capacitive sensor 102 has a much smaller capacitance value than the holding capacitor 104 then the resulting positive voltage increase will be a small increase. When the capacitive sensor 102 is discharged to a lower value voltage, e.g., $V_{SS}$, than the voltage on the holding capacitor 140 and connection to the capacitive sensor 102 will likewise be less.

The delta-sigma circuit shown in FIG. 1 will reduce the duty cycle of the D flip-flop 134 when the resulting voltage is greater than the reference voltage, and will increase the duty cycle of the D flip-flop 134 when the resulting voltage is less than the reference voltage, e.g., charging the capacitive sensor 102 to either $V_{DD}$ or $V_{SS}$, respectively. This is the basis of how to determine when the capacitance value of the capacitive sensor 102 changes.

For example in FIG. 3 when the capacitive sensor 102 at a first capacitance value is charged to a first voltage, e.g., VDD, and then connected in parallel with the holding capacitor 140 the voltage at that instant will rise an increment represented by the numeral 360. The delta-sigma modulator will start to compensate for this increase in voltage by reducing the duty cycle to a lower value than 50 percent. In the case where no object is proximate to the capacitive sensor 102, the duty cycle is about 45 percent. Now when an object is proximate the capacitive sensor 102, the resulting combination of capacitors will produce a greater positive voltage increment represented by the numeral 362 (capacitive sensor 102 has more voltage charge thereon because of its greater capacitance value with an object proximate thereto). In this case, the duty cycle is about 37 percent. Significantly less than the duty cycle when no object is proximate to the capacitive sensor 102.

The capacitive sensor 102 will only be charged to a more positive value when the voltage on the holding capacitor has been discharged through the feedback resistor 138 to a voltage value less than the reference voltage. Since the D flip-flop 134 acts as a one bit memory element, whether to charge the capacitive sensing capacitor or not will be determined one clock later. With the delta-sigma converter, a very small difference in transfer voltage charge values may be easily determined. The more bits (longer sample time) that the first counter/time 128 has, the better the resolution of the voltage charge differences when no object or an object is proximate to the capacitive sensor 102.

Figure 2:
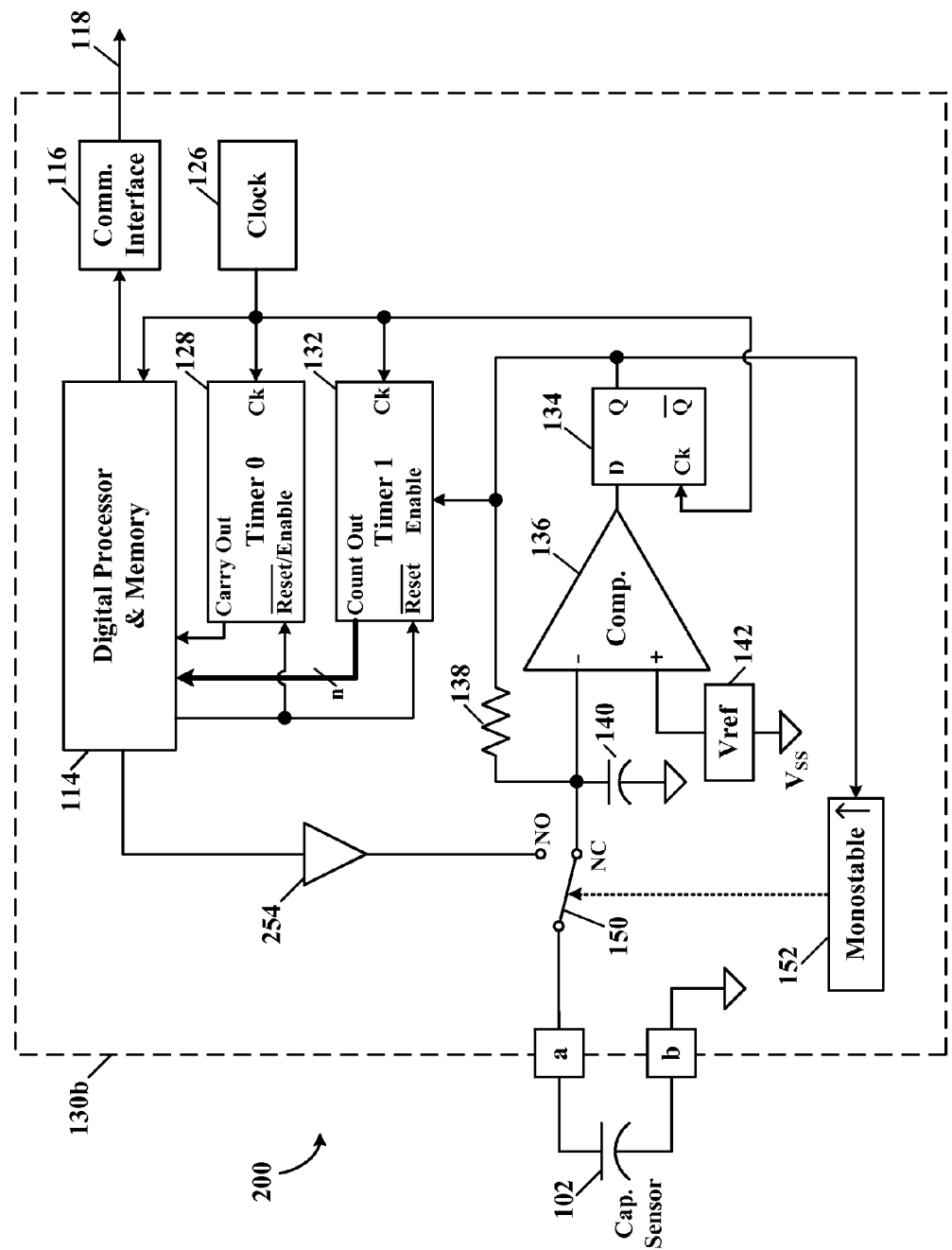
FIG. 2 illustrates a schematic block diagram of a capacitive proximity detection system comprising a capacitive sensor and a delta-sigma analog-to-digital converter, according to another specific example embodiment of this disclosure.

The digital processor and memory 114 may store duty cycles related to capacitance values of the capacitive sensor and when there is a change in a duty cycle the digital processor can generate an object proximity detection, and may further communicate this object proximity detection through the communications interface and over the Referring to FIG. 2, depicted is a schematic block diagram of a capacitive proximity detection system comprising a capacitive sensor and a delta-sigma analog-to-digital converter, according to another specific example embodiment of this disclosure. The circuit shown in FIG. 2 operates substantially the same as the one shown in FIG. 1, but with the addition of a voltage driver 254 that is coupled to a digital output of the digital processor 114 and the switch 150, wherein either a first voltage output, e.g., $V_{DD}$, or a second voltage output, e.g., $V_{SS}$, may be output therefrom and used to charge or discharge, respectively, the capacitive sensor 102. When a more positive voltage than the reference voltage is used to charge the capacitive sensor 102, the duty cycle measured by the delta-sigma converter will decrease when an object is proximate to the capacitive sensor 102. When a less positive voltage than the reference voltage is used to discharge the capacitive sensor 102, the duty cycle measured by the delta-sigma converter will increase when an object is proximate to the capacitive sensor 102.

The digital processor 114 may alternately charge and discharge the capacitive sensor 102 and take duty cycle measurements for each charge and discharge measurement period. For example, in one full conversion of 1024 samples with the capacitive sensor 102 charged each time, another full conversion of 1024 samples with the capacitive sensor 102 discharged each time, and then subtracting the two values for a differential capacitive change measurement. Taking more than 1024 samples will increase the resolution of the capacitive change measurement, wherein 2048 samples gives 11 bit resolution, 4096 gives 12 bit resolution, etc. The size of the feedback resistor 138 may also be adjusted to give a finer resolution about $V_{DD}/2$, higher value resistance gives more resolution to smaller changes, and helps to measure larger changes in the capacitive sensor 102. It is contemplated and within the scope of this disclosure that a programmably variable holding capacitor 140 may be provided so that the delta-sigma converter may be "tuned" for optimal capacitive change resolution. A programmably variable feedback resistor 138 may be provided and used to "tune" capacitive change.

Figure 2A:
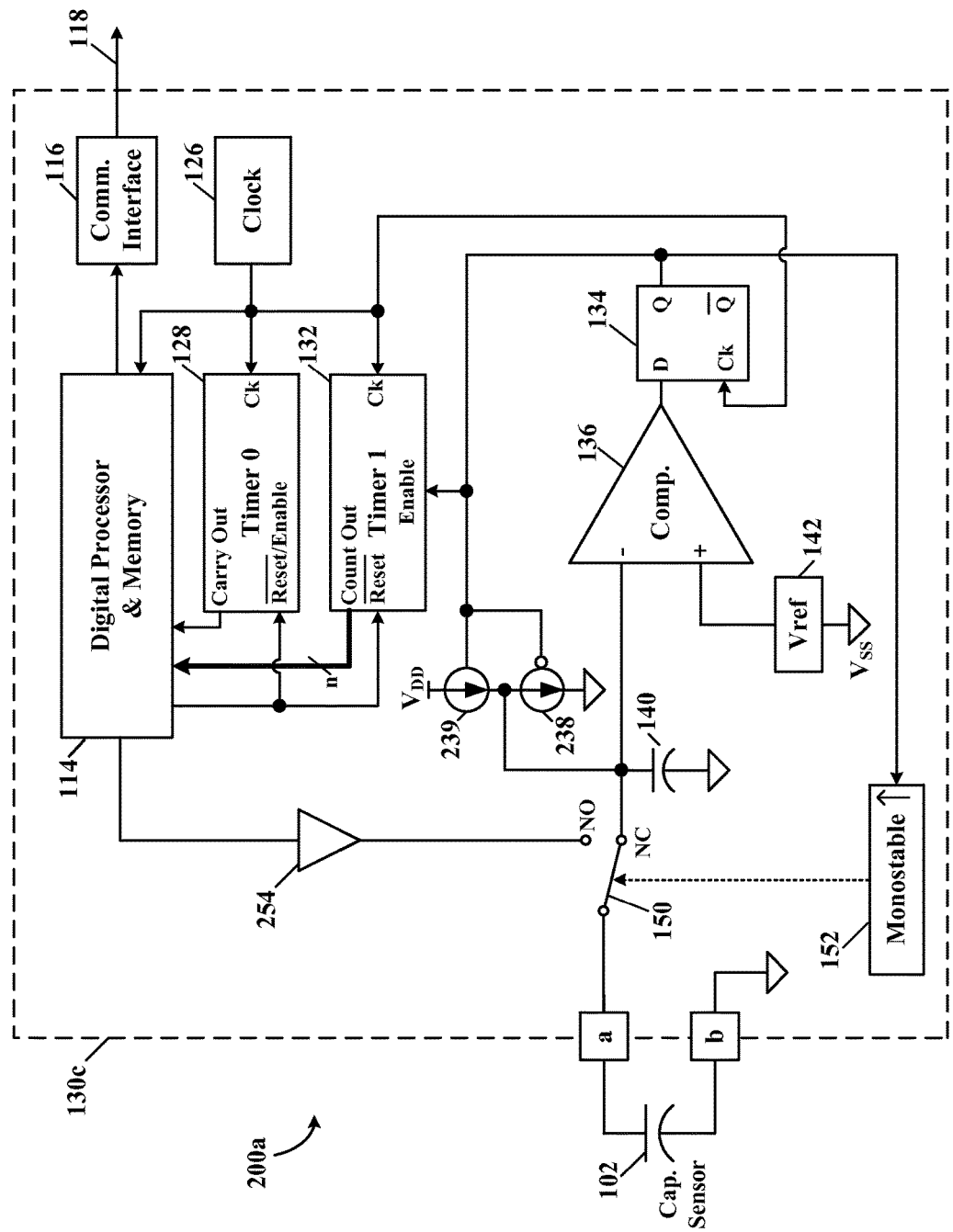
FIG. 2A illustrates a schematic block diagram of a capacitive proximity detection system comprising a capacitive sensor and a delta-sigma analog-to-digital converter, according to yet another specific example embodiment of this disclosure.

Referring to FIG. 2A, the feedback resistor 138 shown in FIGS. 1 and 2 may be replaced with a constant current source 239 and a constant current sink 238 for a more linear charge/discharge of the holding capacitor 140. When the Q-output of the D flip-flop 134 is at a logic high the constant current source 239 may be enabled to source a constant current from $V_{DD}$ to the holding capacitor 140. And when the Q-output of the D flip-flop is at a logic low the constant current sink 238 may be enabled to sink a constant current from the holding capacitor 140 to $V_{SS}$.

The proximity detection systems shown in FIGS. 1, 2 and 2A may be conveniently implemented with a mixed signal (having both analog and digital circuits) integrated circuit device 130, e.g., application specific integrated circuit (ASIC), a programmable logic array, a simple digital state machine (e.g., used as a standalone peripheral), or microcontroller comprising a majority of standard on-chip peripherals. It will provide high resolution and low CPU overhead. It may be implemented in a small pin count devices with low power consumption including sleep mode operation of the digital processor and memory 114 therein.

Figure 4:
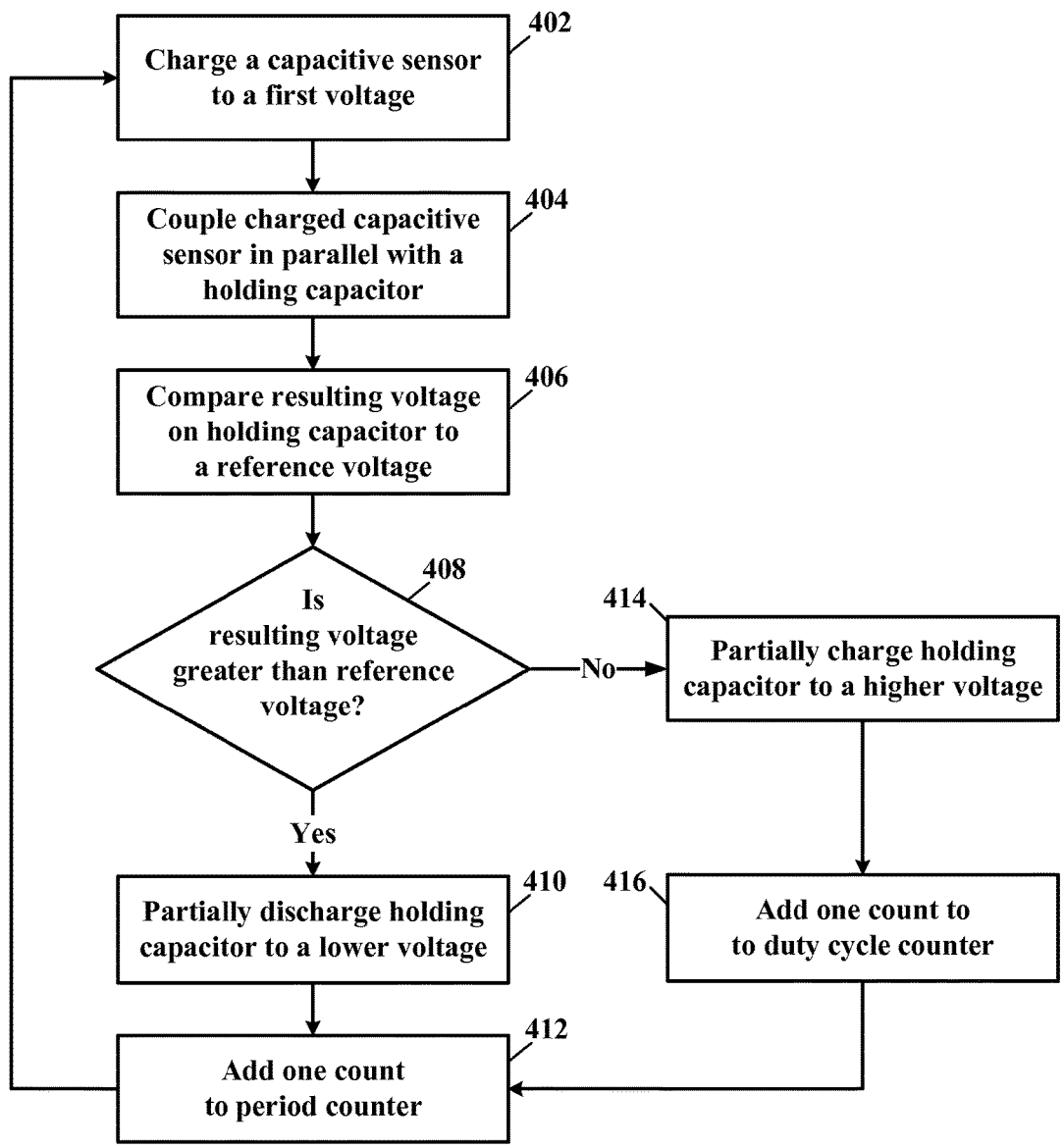
FIGS. 4 and 5 illustrate schematic process flow diagrams of the operation of capacitive proximity detection systems, according to specific example embodiments of this disclosure.
Figure 5:
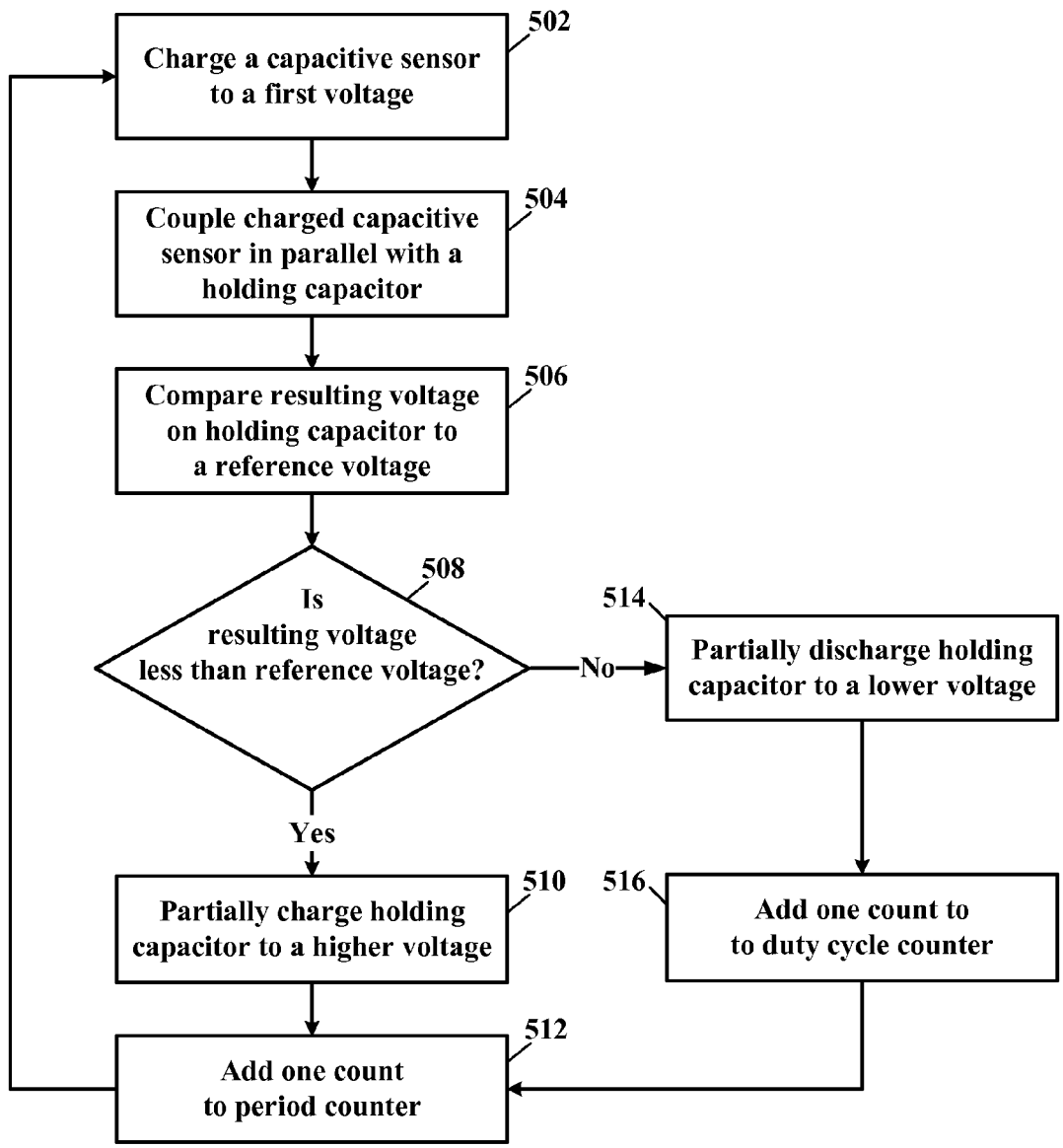

Referring to FIGS. 4 and 5, depicted are schematic process flow diagrams of the operation of capacitive proximity detection systems, according to specific example embodiments of this disclosure. FIG. 4 illustrates the case where the capacitive sensor 102 is charged to a first voltage, e.g., $V_{DD}$, and FIG. 5 illustrates the case where the capacitive sensor 102 is discharged to a second voltage, e.g., $V_{SS}$. Both cases function in substantially the same way.

Referring to FIGS. 4 and 5, depicted are schematic process flow diagrams of the operation of capacitive proximity detection systems, according to specific example embodiments of this disclosure. FIG. 4 illustrates the case where the capacitive sensor 102 is charged to a first voltage, e.g., $V_{DD}$, and FIG. 5 illustrates the case where the capacitive sensor 102 is discharged to a second voltage, e.g., $V_{SS}$. Both cases function in substantially the same way.

In step 402 the capacitive sensor 102 is charged to a first voltage. In step 404 the charged capacitive sensor 102 is coupled in parallel with the holding capacitor 140. In step 406 the resulting voltage on the holding capacitor 140 is compared to a reference voltage, wherein in step 408: if the resulting voltage is greater than the reference voltage, then in step 410 the voltage on the holding capacitor is partially discharged, and in step 412 one count is added to the period counter (timer/counter) 128; if the resulting voltage is less than the reference voltage, then in step 414 the voltage on the holding capacitor is partially charged, in step 416 one count is added to the duty cycle counter (timer/counter) 132, and in step 412 one count is added to the period counter (timer/counter) 128. Then return to step 402.

In step 502 the capacitive sensor 102 is discharged. In step 504 the discharged capacitive sensor 102 is coupled in parallel with the holding capacitor 140. In step 506 the resulting voltage on the holding capacitor 140 is compared to a reference voltage, wherein in step 508: if the resulting voltage is less than the reference voltage, then in step 510 the voltage on the holding capacitor is partially charged, and in step 512 one count is added to the period counter (timer/counter) 128; if the resulting voltage is greater than the reference voltage, then in step 514 the voltage on the holding capacitor is partially discharged, in step 516 one count is added to the duty cycle counter (timer/counter) 132, and in step 512 one count is added to the period counter (timer/counter) 128. Then return to step 502.

A plurality of duty cycle counts may be stored in the digital processor memory 114 each time the period counter 128 times out and these duty cycle counts may be used to determine the duty cycles resulting from capacitance value changes of the capacitive sensor 102 indicating proximity of an object thereto, as more fully described hereinabove.

Figure 6:
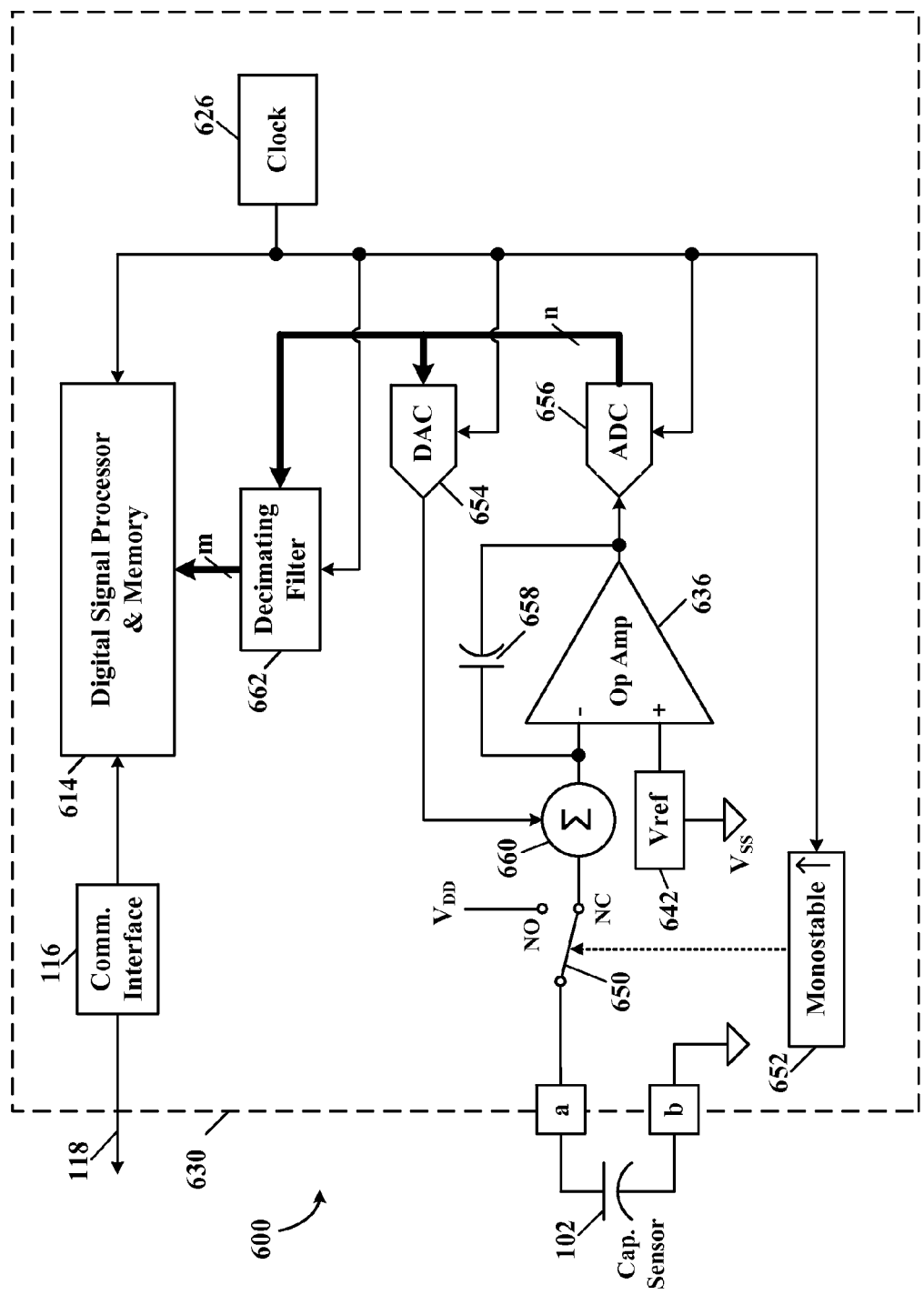
FIG. 6 illustrates a schematic block diagram of a capacitive proximity detection system comprising a capacitive sensor and a delta-sigma analog-to-digital converter, according to still another specific example embodiment of this disclosure.

Referring to FIG. 6, depicted is a schematic block diagram of a capacitive proximity detection system comprising a capacitive sensor and a delta-sigma analog-to-digital converter, according to still another specific example embodiment of this disclosure. A capacitive proximity detection system, generally represented by the numeral 600, may comprise a capacitive sensor 102, a digital signal processor and memory 614, a decimating filter 662, a multi-bit digital-to-analog converter (DAC) 654, a multi-bit analog-to-digital converter (ADC) 656, an operation amplifier 636, an integrating feedback capacitor 658, an analog summer 660, a voltage reference 642, a single pole double throw switch 150, a one shot monostable generator 652, a clock 626, a communications interface 116, and a communications port 118. The aforementioned elements, except for the capacitive sensor 102 may be provided by a mixed signal (having both analog and digital circuits) integrated circuit device 630, e.g., application specific integrated circuit (ASIC), a programmable logic array, a simple digital state machine (e.g., used as a standalone peripheral), or microcontroller. The communications interface 116 may be a serial communications interface, e.g., RS-232, USB, SPI, I²C, Microwire or UNI/O and the like, and may provide data, e.g., proximity detection and alarm through the communications port 118, a parallel bus (not shown) and/or individual indicators (e.g., LEDs) (not shown) that set/clear when a person or object is in proximity to the capacitive sensor 102.

The capacitive sensor 102 is charged to a voltage, e.g., $V_{DD}$, in a short time by a circuit that connects the capacitive sensor 102 thereto. This circuit may comprise, but is not limited to, a switch 650 controlled by the one shot monostable generator 652 that causes the switch 650 to briefly couple the capacitive sensor 102 to $V_{DD}$ and then back to an input of the summer 660. The monostable generator 652 and switch 650 are shown for explanatory purposes but one having ordinary skill in digital circuit design and the benefit of this disclosure could easily come up with alternate and equally effective circuits for quickly charging and then reconnecting the capacitive sensor 102 to summer 660.

An output from the DAC 654 is coupled to a second input of the summer 660. The DAC 654 may be a multi-bit DAC, e.g., two bits having four voltage input levels. The summer 660 adds together the voltage from the capacitive sensor 102 and the voltage output from the DAC 654. The operational amplifier 636 in combination with the integration capacitor 658, integrates a difference between the output voltage from the summer 660 and a reference voltage from the voltage reference 642. The reference voltage may be, but is not limited to, $V_{DD}/2$. The integrated voltage output from the operational amplifier 636 is sampled by the ADC 656 every clock pulse from the clock 626, and on the next clock pulse a digital representation thereof is available at the output of the ADC 656. The ADC 656 may have a multi-level output, e.g., two bits having four output levels. The multi-level output from the ADC 656 is coupled to the DAC 654 and a decimating filter 662. Operation of the ADC 656, DAC 654 and decimating filter 662 are synchronized at each clock pulse from the clock 626. A multi-bit output from the decimating filter 662 may be coupled to the digital signal processor 614. For further processing to obtain proximity detection of an object as more fully described hereinabove.

The circuit shown in FIG. 6 provides substantially the same results as the circuits shown in FIGS. 1, 2 and 2A, e.g., proximity detection, wherein the first and second counter/timers 128 and 132 are replaced by the decimating filter 662 and digital signal processor 614. The holding capacitor 140, feedback resistor 138, voltage comparator 136 and D-flip flop 134 are replaced by the summer 660, operational amplifier 636, integrating capacitor 658, ADC 656 and DAC 654. An advantage of the embodiment shown in FIG. 6 is its ability to do sigma-delta conversions faster because of its multi-bit capabilities, thereby more quickly detecting a change in capacitance of the capacitive sensor indicating proximity of an object thereto.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A proximity detection system, said system comprising:
   a comparator having first and second inputs and an output, wherein the second input is coupled with a reference voltage and the first input is coupled with a holding capacitor;
   a capacitive sensor;
   a switch for coupling the capacitive sensor alternately to a voltage and the holding capacitor;
   a clock having an output;
   a flip-flop having an input coupled with the output of the comparator, a clock input coupled to the output of the clock and an output;
   a feedback resistor coupled between the output of the flip-flop and the first input of the comparator;
   a duty cycle counter having a clock input coupled to the output of the clock, a reset input, an enable input coupled to the output of the flip-flop, and an output for providing a number of clock outputs counted, wherein the duty cycle counter only counts the clock outputs when the enable input thereof is at a first logic level; and
   a circuit for controlling the switch whenever the output of the flip-flop goes from a second logic level to the first logic level;
   wherein the number of clock outputs counted are used in determining proximity of an object to the capacitive sensor.

2. The proximity detection system according to claim 1, further comprising a period counter having a clock input coupled to the output of the clock, a reset/enable input and a carry output, wherein the period counter determines a measurement time period.

3. The proximity detection system according to claim 2, wherein count values in the duty cycle and period counters are used in determining a duty cycle dependent upon a capacitance value of the capacitive sensor.

4. The proximity detection system according to claim 3, wherein the duty cycle is the count value in the duty cycle counter divided by the count value in the period counter.

5. The proximity detection system according to claim 4, further comprising a digital processor and memory coupled to the clock, and the duty cycle and period counters, wherein the digital processor reads the count values from the duty cycle and period counters, and therefrom determines duty cycles related to capacitance values of the capacitive sensor.

6. The proximity detection system according to claim 5, wherein the duty cycles related to capacitance values of the capacitive sensor are stored in the digital processor memory and compared in determining whether a duty cycle change indicates a detection of an object proximate to the capacitive sensor.

7. The proximity detection system according to claim 5, wherein the carry output of the period counter generates an interrupt signal to the digital processor.

8. The proximity detection system according to claim 1, wherein the voltage coupled to the capacitive sensor is at a logic high.

9. The proximity detection system according to claim 1, wherein the voltage coupled to the capacitive sensor is at a logic low.

10. The proximity detection system according to claim 5, further comprising an output driver having an input coupled the digital processor and an output coupled to the switch wherein the voltage coupled to the capacitive sensor alternates between a logic high and a logic low for sequential duty cycle periods.

11. The proximity detection system according to claim 5, wherein a microcontroller comprises the digital processor and memory, the comparator, the clock, the flip-flop, the feedback resistor, the duty cycle counter, the period counter, the switch, and the circuit for controlling the switch.

12. The proximity detection system according to claim 1, wherein a capacitance value of the holding capacitor is programmably adjustable.

13. The proximity detection system according to claim 1, wherein a resistance value of the feedback resistor is programmably adjustable.

14. A method for detecting an object proximate to a capacitive sensor, said method comprising the steps of:
   charging a capacitive sensor to a first voltage;
   coupling the charged capacitive sensor in parallel with a holding capacitor;
   comparing a resulting voltage on the parallel connected capacitive sensor and holding capacitor to a reference voltage with a voltage comparator, wherein:
   if the resulting voltage is greater than the reference voltage then partially discharge the holding capacitor to a lower voltage, and
   if the resulting voltage is less than the reference voltage then partially charge the holding capacitor to a higher voltage and add one count to a duty cycle counter;
   add one count to a period counter;
   return to the step of charging the capacitive sensor to the first voltage.

15. The method according to claim 14, further comprising the steps of:
   storing a plurality of duty cycle period counts; and
   calculating duty cycles from the plurality of duty cycle counts divided by respective ones of the plurality of period counts.

16. The method according to claim 15, further comprising the step of determining proximity of an object to the capacitive sensor from the duty cycles.

17. The method according to claim 15, further comprising the step of determining changes in capacitance values of the capacitive sensor from the duty cycles.

18. A method for detecting an object proximate to a capacitive sensor, said method comprising the steps of:
   discharging a capacitive sensor;
   coupling the discharged capacitive sensor in parallel with a holding capacitor;
   comparing a resulting voltage on the parallel connected capacitive sensor and holding capacitor to a reference voltage with a voltage comparator, wherein:
   if the resulting voltage is less than the reference voltage then partially charge the holding capacitor to a higher voltage, and
   if the resulting voltage is greater than the reference voltage then partially discharge the holding capacitor to a higher voltage and add one count to a duty cycle counter;
   add one count to a period counter;
   return to the step of charging the capacitive sensor to the first voltage.

19. The method according to claim 18, further comprising the steps of:
   storing a plurality of duty cycle period counts; and
   calculating duty cycles from the plurality of duty cycle counts divided by respective ones of the plurality of period counts.

20. The method according to claim 19, further comprising the step of determining proximity of an object to the capacitive sensor from the duty cycles.

21. The method according to claim 19, further comprising the step of determining changes in capacitance values of the capacitive sensor from the duty cycles.

22. An apparatus for proximity detection, comprising:
a comparator having first and second inputs and an output, wherein the second input is coupled with a reference voltage and the first input is coupled with a holding capacitor;
a switch adapted for coupling a capacitive sensor alternately to a voltage and the holding capacitor;
a clock having an output;
a flip-flop having an input coupled with the output of the comparator, a clock input coupled to the output of the clock and an output;
a feedback resistor coupled between the output of the flip-flop and the first input of the comparator;
a duty cycle counter having a clock input coupled to the output of the clock, a reset input, an enable input coupled to the output of the flip-flop, and an output for providing a number of clock outputs counted, wherein the duty cycle counter only counts the clock outputs when the enable input thereof is at a first logic level; and
a circuit for controlling the switch whenever the output of the flip-flop goes from a second logic level to the first logic level.

23. The apparatus according to claim 22, wherein a resistance value of the feedback resistor is programmably adjustable.

24. The apparatus according to claim 22, wherein the number of clock outputs counted are used in determining proximity of an object to the capacitive sensor.

25. The apparatus according to claim 22, wherein the number of clock outputs counted are used in determining changes in capacitances values of the capacitive sensor.

26. The apparatus according to claim 22, wherein a capacitance value of the holding capacitor is programmably adjustable.

* * * * *